(12) United States Patent
Zhang et al.

(10) Patent No.: US 11,346,808 B2
(45) Date of Patent: May 31, 2022

(54) TRACE DETECTION DEVICE

(71) Applicants: NUCTECH COMPANY LIMTED, Beijing (CN); Tsinghua University, Beijing (CN)

(72) Inventors: Qingjun Zhang, Beijing (CN); Yuanjing Li, Beijing (CN); Zhiqiang Chen, Beijing (CN); Jianmin Li, Beijing (CN); Yinong Liu, Beijing (CN); Yaohong Liu, Beijing (CN); Yanqin Zhao, Beijing (CN); Lili Yan, Beijing (CN); Biao Cao, Beijing (CN); Qiufeng Ma, Beijing (CN); Ge Li, Beijing (CN)

(73) Assignees: Nuctech Company Limited, Beijing (CN); Tsinghua University, Beijing (CN)

( * ) Notice: Subject to any disclaimer, the term of this patent is extended or adjusted under 35 U.S.C. 154(b) by 79 days.

(21) Appl. No.: 16/934,520

(22) Filed: Jul. 21, 2020

(65) Prior Publication Data

US 2021/0025849 A1    Jan. 28, 2021

(30) Foreign Application Priority Data

Jul. 23, 2019    (CN) .......................... 201910670828.0

(51) Int. Cl.
*G01N 27/622* (2021.01)
*G01N 27/626* (2021.01)
*H05K 1/02* (2006.01)

(52) U.S. Cl.
CPC ......... *G01N 27/622* (2013.01); *G01N 27/626* (2013.01); *H05K 1/0254* (2013.01); *H05K 2201/10151* (2013.01)

(58) Field of Classification Search
CPC .. G01N 27/622; G01N 27/626; H05K 1/0254; H05K 2201/10151; H01J 49/02; H01J 49/00; H01J 49/04
USPC ......................................... 250/281, 282, 288
See application file for complete search history.

(56) References Cited

U.S. PATENT DOCUMENTS

| 4,712,008 A | 12/1987 | Vora et al. |
| 2011/0168884 A1 | 7/2011 | Li et al. |
| 2018/0164262 A1* | 6/2018 | Zhang .................. H01J 49/062 |

FOREIGN PATENT DOCUMENTS

| CN | 201034991 Y | 3/2008 |
| CN | 102315075 A | 1/2012 |
| CN | 102522308 A | 6/2012 |
| CN | 103887140 A | 6/2014 |

(Continued)

OTHER PUBLICATIONS

First Office Action for Chinese Patent Application No. 201910670828.0 dated Jun. 30, 2021, 23 pages.

(Continued)

*Primary Examiner* — Michael Maskell
(74) *Attorney, Agent, or Firm* — Merchant & Gould P.C.

(57) ABSTRACT

The present disclosure provides a trace detection device. The trace detection device includes: a box body comprising a main body frame and a top plate, the top plate and the main body frame forming a fully enclosed cavity; an ion migration tube assembly in the cavity and on a first side of the cavity; and a preamplifier and high voltage circuit board in the cavity and on a second side of the cavity, the second side being opposite to the first side.

13 Claims, 1 Drawing Sheet

(56) References Cited

FOREIGN PATENT DOCUMENTS

| CN | 106645472 A | 5/2017 |
|----|-------------|--------|
| CN | 107907622 A | 4/2018 |
| WO | 93/06476 A1 | 4/1993 |
| WO | 2013/102420 A1 | 7/2013 |

OTHER PUBLICATIONS

Examination Report for Canadian Patent Application No. 3,087,427 dated Aug. 16, 2021, 3 pages.
Cao, S. et al., "Dual ion mobility spectrometer based on AC coupling", J. Tsinghua Univ (Sci & Technol), 53(10): 1374-1379 (2013); English Abstract.
Combined Search and Examination Report for United Kingdom Patent Application No. GB2011266.0 dated Apr. 7, 2021, 7 pages.

* cited by examiner

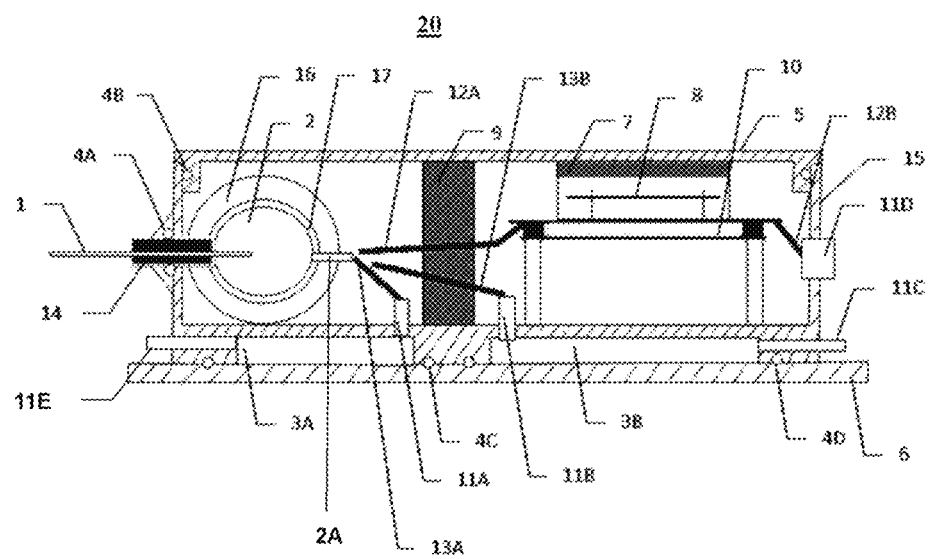

TRACE DETECTION DEVICE

CROSS-REFERENCE TO RELATED APPLICATION

This application claims the benefit of Chinese Patent Application No. 201910670828.0 filed on Jul. 23, 2019 in the National Intellectual Property Administration of China, the whole disclosure of which is incorporated herein by reference.

TECHNICAL FIELD

The present disclosure relates to the technical field of trace analysis and detection, in particular to a trace detection device.

BACKGROUND

Trace detection device has many advantages such as small size, low power consumption, high portability, fast detection speed, high sensitivity, and industrialization. Therefore, it is widely used in field inspections in the fields of military, national defense, public security, and so on.

Generally, the wild environment is harsh, such as rainy and humid weather, seaside salt fog zone, tropical rainforest high humidity area, and the like. The trace detection device comprises some components sensitive to the environment, such as a ceramic migration tube, a preamplifier circuit, a high voltage circuit, that need to do waterproof and moisture-proof design.

At present, preamplifier circuit board and high voltage circuit board generally use three-proof glue for waterproof and moisture-proof treatment. On the one hand, this treatment cannot isolate the circuit board from the environment. Meanwhile, under severe environmental conditions, the aging speed of three-proof glue is accelerated, shortening the service life of the instrument. In case of operating in a high humidity and salt fog environment for a long time, the circuit is easy to be damaged. On the one hand, the parameters of the circuit may change, which affects detection sensitivity of the trace detection device and stability of instrument. On the other hand, it will cause short circuit and open circuit of the circuit, increasing the failure rate of the instrument.

For the migration tube, it comprises a migration tube body and a partial pressure resistance, and a thermal insulation layer wrapped outside is generally ceramic or glass wool. The thermal insulation layer is easy to absorb moisture. In case of operating in a harsh environment for a long time, water molecules are easy to penetrate into the migration tube body and the partial pressure resistance through the thermal insulation layer. Especially for the ceramic migration tube, it is easier to absorb moisture and cause a change in the field strength of the migration tube, which affects the signal stability of the trace detection device.

In summary, the use of existing trace detection device is still limited to a certain extent by the external environment.

SUMMARY

One of the objects of the present disclosure is to at least partially eliminate or mitigate the above-mentioned technical problems and provide a new trace detection device.

According to one aspect, there is provided a trace detection device, wherein the trace detection device comprises:

a box body comprising a main body frame and a top plate, the top plate and the main body frame forming a fully enclosed cavity;

an ion migration tube assembly in the cavity and on a first side of the cavity; and a preamplifier and high voltage circuit board in the cavity and on a second side of the cavity, the second side being opposite to the first side.

In an embodiment, the trace detection device further comprises a bottom support plate, and a first buffer bin between the bottom support plate and a bottom plate of the main body frame, and migration gas is input from the first buffer bin to the ion migration tube through a first gas pipe assembly.

In an embodiment, the trace detection device further comprises a second buffer bin between the bottom support plate and the bottom plate of the main body frame, exhaust gas of the ion migration tube is output to the second buffer bin through a second gas pipe assembly, and the first buffer bin and the second buffer bin are respectively hermetically connected to corresponding parts of the box body through respective O-type rings.

In an embodiment, the ion migration tube assembly comprises an ion migration tube, a heating layer outside the ion migration tube, and a thermal insulation layer outside the heating layer.

In an embodiment, the trace detection device further comprises a multicapillary column (MCC) inserted into the ion migration tube through a fixing sleeve that passes through a side wall of the box body.

In an embodiment, the fixing sleeve is hermetically connected to an outer surface of the side wall of the box body through an O-type ring.

In an embodiment, the ion migration tube is electrically connected to the preamplifier and high voltage circuit board through a first connecting wire, and the preamplifier and high voltage circuit board is led out of the box body through a second connecting wire.

In an embodiment, the preamplifier and high voltage circuit board is connected to a connector on the box body through the second connecting wire, and the connector transmits a preamplifier signal to a main control board and receives power from the main control board.

In an embodiment, a thermally conductive material is provided between the preamplifier and high voltage circuit board and the top plate of the box body.

In an embodiment, a thermally insulating material is provided between the ion migration tube assembly and the preamplifier and high voltage circuit board.

In an embodiment, the preamplifier and high voltage circuit board is supported by a partition fixed on the bottom plate of the main body frame.

In an embodiment, an outward protruding portion of an end of the top plate is hermetically connected to the main body frame of the box body through an O-type ring.

In an embodiment, the first buffer bin has an air inlet pipe joint, the second buffer bin has an air outlet pipe joint, and a purification device is provided between the air outlet pipe joint of the second buffer bin and the air inlet pipe joint of the first buffer bin.

In an embodiment, a diaphragm pump is further provided between the air outlet pipe joint of the second buffer bin and the purification device.

BRIEF DESCRIPTION OF THE DRAWINGS

In order to more clearly explain the embodiments of the present disclosure or the technical solutions in the related art, the following will briefly introduce the drawings needed in the embodiments or the description of the related art. Obviously, the drawings in the following description are some embodiments of the present disclosure. For those ordinary skilled in the art, other drawings can be obtained based on these drawings without paying any inventive effort.

FIG. 1 is a structural cross-sectional view of a trace detection device according to an embodiment of the present disclosure.

DETAILED DESCRIPTION

The technical solutions in the embodiments of the present disclosure will be described clearly in combination with the drawings in the embodiments of the present disclosure. Obviously, the described embodiments are part of the embodiments of the present disclosure, not all of them. All other embodiments obtained by those ordinary skilled in the art based on the embodiments in the present disclosure without paying inventive efforts fall within the scope of protection of the present disclosure.

In addition, in the following detailed description, for the convenience of explanation, many specific details are set forth to provide a comprehensive understanding of the embodiments of the present disclosure. Obviously, however, one or more embodiments can be implemented without these specific details. In other cases, well-known structures and devices are shown in diagrams to simplify the drawings.

FIG. 1 illustrates a structural cross-sectional view of a trace detection device according to an embodiment of the present disclosure. The trace detection device 20 mainly comprises three modules, i.e., an ion migration tube assembly, a preamplifier and high voltage circuit board, and a box body.

Specifically, the ion migration tube assembly comprises an ion migration tube 2, and a heating layer 17 and a thermal insulation layer 16 that are sequentially disposed outside the ion migration tube 2. In order to achieve the best possible sealing or isolation, in this embodiment, the box body is designed to be fully sealed, or the box body has a fully enclosed cavity. In order to form or realize the fully enclosed cavity, the box body comprises a main body frame 15 and a top plate 5. The main body frame 15 is a closed structure with an opening at the top. That is, the top plate 5 is hermetically connected to the main body frame 15 in a detachable manner.

In one example, the ion migration tube assembly or the ion migration tube 2 is in the cavity and on a left side of the cavity. Correspondingly, the preamplifier and high voltage circuit board 8 is in the cavity and on a right side of the cavity.

In one example, an end of the top plate 5 is provided with an outward protruding portion that is hermetically connected to the inside of the main body frame 15 through an O-type ring 4B.

The trace detection device further comprises a multicapillary column (MCC) 1, which is inserted into the ion migration tube 2 through a fixing sleeve 14 that passes through a left side wall of the main body frame 15, the thermal insulation layer 16 and the heating layer 17. The fixing sleeve 14 is hermetically connected to the outer surface of the left side wall of the main body frame 15 through an O-type ring 4A. The MCC is inserted into the ion migration tube 2 through the fixing sleeve 14, which facilitates the replacement of the MCC.

A bottom support plate 6 is further provided below the box body. A buffer bin 3A is provided between the bottom support plate 6 and a bottom plate of the main body frame 15 and on the left side of the entire device as shown. A first gas pipe assembly comprises a gas pipe joint 2A that passes through the heating layer 17 and the thermal insulation layer 16 and that leads out migration gas from the ion migration tube 2, a first gas pipe 13A, and a gas pipe joint 11A of the buffer bin 3A, wherein the gas pipe joint 2A, the first gas pipe 13A and the gas pipe joint 11A are connected in sequence. The migration gas is input from the buffer bin 3A to the ion migration tube through the first gas pipe assembly. In one example, for the convenience of guiding the migration gas, the buffer bin 3A is disposed to substantially relative to the ion migration tube 2, that is, substantially below the ion migration tube 2.

In addition, the buffer bin 3B is located at another position between the bottom support plate 6 and the bottom plate of the main body frame 15 where the buffer bin 3A is not provided, and the buffer bin 3B and the buffer bin 3A are isolated from each other. Exhaust gas in the ion migration tube 2 is output to the second buffer bin 3B through a second gas pipe assembly. The second gas pipe assembly comprises a gas pipe joint 2A that passes through the heating layer 17 and the thermal insulation layer 16 and that leads out carrier gas from the ion migration tube 2, a second gas pipe 13B, and a gas pipe joint 11B of the buffer bin 3B, wherein the gas pipe joint 2A, the second gas pipe 13B and the gas pipe joint 11B are connected in sequence. In addition, the right end of the buffer bin 3B is further provided with a gas pipe joint 110 for leading out the exhaust gas therein. The gas pipe joint 11C is connected to an air inlet of the external diaphragm pump. The air outlet of the diaphragm pump is connected to the air inlet of the external purification device, and the air outlet of the purification device is connected to a port 11E of the buffer bin 3A. The buffer bin 3A and the buffer bin 3B are provided because the diaphragm pump is a pulse pump and the air flow is not stable, which may affect the stability of the spectral shape of the migration tube. Providing the buffer bins can stabilize the airflow of the diaphragm pump and stabilize the spectral shape of the migration tube. Of course, the diaphragm pump and the purification device may also be provided inside the box body, so that the integration level is higher, but replacement, maintenance and cleaning may not be as convenient as provided outside.

In one example, the bottom support plate 6 and the bottom plate of the main body frame 15 are sealed to each other by the respective O-type rings 4C and 4D around the buffer bin 3A and the buffer bin 3B.

By providing the buffer bins 3A and 3B, the fluctuation of the ion mobility spectrum baseline can be effectively reduced.

The MCC and the fixing sleeve 14, the buffer bins 3A and 3B are respectively fixed to the corresponding parts of the box body through the same integrated design such as the O-type ring, which facilitates the gas path interconnection of the ion migration tube 2, making the structure simple and the gas path layout neat.

The preamplifier and high voltage circuit board 8 is supported by a partition 10 and fixed on the bottom plate of the main body frame.

The preamplifier and high voltage circuit board 8 not only provides a migration electric field, but also receives a measurement signal of the mobility spectrum of the ion to be measured generated in the ion migration tube. Therefore, the ion migration tube 2 is connected to the preamplifier and high voltage circuit board 8 through a connecting wire 12A. The preamplifier and high voltage circuit board is connected to a connector 11D on the box body through a connecting wire 12B. The connector 11D transmits a preamplifier signal to a main control board and receives power from the main control board.

A thermally conductive material 7 is designed between the preamplifier and high voltage circuit board 8 and the top plate 5 to facilitate the output of the heat generated by the preamplifier and high voltage circuit board 8 to the box body. A thermally insulating material 9 is designed between the ion migration tube 2 and the preamplifier and high voltage circuit board 8, so as to ensure that the heat of the migration tube 2 is not transmitted to the preamplifier and high voltage circuit board 8.

The box body comprising the main body frame 15 is a fully sealed design, and the top plate 5 is tightly combined with the main body frame 15 through the O-type ring 4B. The O-type ring 4B is used to seal a top plate 5 to facilitate the disassembly of the top plate and the assembly, disassembly and maintenance of the ion mobility spectrometer, wherein the ion mobility spectrometer comprises an ion migration tube assembly and a preamplifier and high voltage circuit board.

The ion mobility spectrometer is a highly sensitive and precise instrument. During its operation, it requires that the electric field of the ion migration tube 2 is stable, the high voltage circuit is stable, and the preamplifier circuit for charge collection and processing is stable, otherwise signal measurement will be seriously affected. If the ion mobility spectrometer operates in a high-humidity environment for a long time, the water vapor in the environment is easy to penetrate into the migration tube body, which may affect the insulation of the migration tube and result in a change in the field strength of the migration tube, thus affecting the signal. At the same time, the preamplifier and high voltage circuit board of the ion mobility spectrometer involves precision circuit design. In case of operating in a high-humidity environment for a long time, the circuit is easy to be damaged. On the one hand, parameters of the circuit may change, thus affecting detection sensitivity of the ion mobility spectrometer and stability of the instrument. On the other hand, it may cause short circuit and open circuit of the circuit, increasing the failure rate of the instrument. For the fully sealed design of the main body frame 15 and the top plate 5 of the box body, on the one hand, the migration tube and the preamplifier and high voltage circuit board can be effectively isolated from the external environment, which effectively avoids the influence of harsh environments, such as high temperature, high humidity, salt frog, and the like, on the ion mobility spectrometer, reducing the loss and interference of the ion mobility spectrometer detection signal during transmission, and improving the stability and reliability of the ion mobility spectrometer; on the other hand, a mechanical package is added to the precise module structure of the ion mobility spectrometer to provide sufficient protection, prolonging the service life of the ion mobility spectrometer.

The trace detection device provided by the present disclosure has at least one or at least some of the following advantages.

Specifically, (1) a box body is added outside the ion migration tube and the preamplifier and high voltage circuit board of the trace detection device, the box body adopts a fully sealed design, the top plate of the box body is tightly connected to the main body frame of the box body through the O-type ring, and the O-type ring is used to seal the top plate, which facilitates the disassembly of the top plate and the assembly, disassembly and maintenance of the ion migration tube assembly; the protective sleeve of the MCC of the trace detection device is effectively sealed with the box body through the O-type ring to facilitate the replacement of the MCC;

(2) the two buffer bins are fixed between the box body and the bottom support plate through O-type rings, the buffer bins and the ion migration tube assembly or module adopt the same sealing design, which facilitates the gas path interconnection of the migration tube, making the structure simple and the gas path layout neat;

(3) the fully sealed box body design has the advantages of: ① effectively isolating the migration tube and the preamplifier and high voltage circuit board from the environment, reducing the loss and interference of the detection signal of the trace detection device during transmission, improving the detection sensitivity of the trace detection device and the stability and reliability of the instrument, and effectively reducing the failure rate of the instrument; ② improving the environmental adaptability of the trace detection device, so that the trace detection device can operate in harsh environments such as open air, high temperature, high humidity, salt frog, and the like; ③ adding a mechanical package to the precision module structure of the trace detection device to provide sufficient protection and prolong the service life of the trace detection device.

The invention claimed is:

1. A trace detection device, wherein the trace detection device comprises:
   a box body comprising a main body frame and a top plate, the top plate and the main body frame forming a fully enclosed cavity;
   an ion migration tube assembly in the cavity and on a first side of the cavity; and
   a preamplifier and high voltage circuit board in the cavity and on a second side of the cavity, the second side being opposite to the first side;
   wherein the trace detection device further comprises:
   a bottom support plate; and
   a first buffer bin between the bottom support plate and a bottom plate of the main body frame, with migration gas being input from the first buffer bin to an ion migration tube through a first gas pipe assembly;
   wherein the trace detection device further comprises:
   a second buffer bin between the bottom support plate and the bottom plate of the main body frame, with exhaust gas of the ion migration tube being output to the second buffer bin through a second gas pipe assembly, the first buffer bin and the second buffer bin being respectively hermetically connected to corresponding parts of the box body through respective O-type rings.

2. The trace detection device according to claim 1, wherein the ion migration tube assembly comprises: an ion migration tube, a heating layer outside the ion migration tube, and a thermal insulation layer outside the heating layer.

3. The trace detection device according to claim 2, wherein:
   the trace detection device further comprises a multicapillary column inserted into the ion migration tube through a fixing sleeve that passes through a side wall of the box body.

4. The trace detection device according to claim 3, wherein the fixing sleeve is hermetically connected to an outer surface of the side wall of the box body through an O-type ring.

5. The trace detection device according to claim 2, wherein the ion migration tube is electrically connected to the preamplifier and high voltage circuit board through a first connecting wire, and the preamplifier and high voltage circuit board is led out of the box body through a second connecting wire.

6. The trace detection device according to claim 5, wherein the preamplifier and high voltage circuit board is connected to a connector on the box body through the second connecting wire, and the connector transmits a preamplifier signal to a main control board and receives power from the main control board.

7. The trace detection device according to claim 1, wherein a thermally conductive material is provided between the preamplifier and high voltage circuit board and the top plate of the box body.

8. The trace detection device according to claim 1, wherein a thermally insulating material is provided between the ion migration tube assembly and the preamplifier and high voltage circuit board.

9. The trace detection device according to claim 1, wherein the preamplifier and high voltage circuit board is supported by a partition fixed on the bottom plate of the main body frame.

10. The trace detection device according to claim 1, wherein an outward protruding portion of an end of the top plate is hermetically connected to the main body frame of the box body through an O-type ring.

11. The trace detection device according to claim 1, wherein the first buffer bin has an air inlet pipe joint, the second buffer bin has an air outlet pipe joint, and a purification device is provided between the air outlet pipe joint of the second buffer bin and the air inlet pipe joint of the first buffer bin.

12. The trace detection device according to claim 11, wherein a diaphragm pump is further provided between the air outlet pipe joint of the second buffer bin and the purification device.

13. The trace detection device according to claim 7, wherein the ion migration tube assembly comprises: an ion migration tube, a heating layer outside the ion migration tube, and a thermal insulation layer outside the heating layer.

\* \* \* \* \*